United States Patent
Liu

(10) Patent No.: US 10,365,522 B2
(45) Date of Patent: Jul. 30, 2019

(54) GOA DRIVING PANEL

(71) Applicant: Wuhan China Star Optoelectronics Technology Co., Ltd., Wuhan, Hubei (CN)

(72) Inventor: Yuanfu Liu, Shenzhen (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 184 days.

(21) Appl. No.: 15/520,695

(22) PCT Filed: Mar. 17, 2017

(86) PCT No.: PCT/CN2017/077073
§ 371 (c)(1),
(2) Date: Apr. 20, 2017

(87) PCT Pub. No.: WO2018/152900
PCT Pub. Date: Aug. 30, 2018

(65) Prior Publication Data
US 2018/0299718 A1 Oct. 18, 2018

(30) Foreign Application Priority Data
Feb. 27, 2017 (CN) .......................... 2017 1 0107103

(51) Int. Cl.
*G02F 1/1345* (2006.01)
*H01L 27/12* (2006.01)
(Continued)

(52) U.S. Cl.
CPC ........ *G02F 1/13454* (2013.01); *G02F 1/1368* (2013.01); *G09G 3/36* (2013.01);
(Continued)

(58) Field of Classification Search
CPC .............. G02F 1/13454; G02F 1/1368; G09G 2300/0408; G09G 2310/0267;
(Continued)

(56) References Cited

U.S. PATENT DOCUMENTS

2001/0028337 A1* 10/2001 Wu ...................... G09G 3/3677
345/100
2003/0223138 A1* 12/2003 Akiyama ............ H01L 51/0013
359/883

(Continued)

FOREIGN PATENT DOCUMENTS

| CN | 101847639 A | 9/2009 |
| JP | H07218896 A | 8/1995 |
| KR | 20070064458 A | 6/2007 |

*Primary Examiner* — Viet D Pham

(57) ABSTRACT

A GOA driving panel is disclosed. The GOA driving panel includes an active area and a non-active area arranged at two opposite sides of the active area. The non-active area is provided with a plurality of GOA driving units, and each GOA driving unit is connected with one corresponding scanning line in the active area for outputting a scanning signal to the scanning line. The non-active area is further provided with a plurality of signal waveform delay units, and each signal waveform delay unit is arranged between a GOA driving unit and a corresponding scanning line.

19 Claims, 3 Drawing Sheets

(51) Int. Cl.
*H01L 27/13* (2006.01)
*G09G 3/36* (2006.01)
*G02F 1/1368* (2006.01)

(52) U.S. Cl.
CPC ......... *G09G 3/3677* (2013.01); *H01L 27/124* (2013.01); *H01L 27/13* (2013.01); *G09G 2300/0408* (2013.01); *G09G 2310/0267* (2013.01); *G09G 2320/0219* (2013.01); *G09G 2320/0223* (2013.01); *G09G 2320/0247* (2013.01)

(58) Field of Classification Search
CPC ... G09G 2320/0219; G09G 2320/0247; G09G 3/36; G09G 3/3677; H01L 27/124; H01L 27/13
See application file for complete search history.

(56) References Cited

U.S. PATENT DOCUMENTS

| | | | |
|---|---|---|---|
| 2005/0018121 A1* | 1/2005 | Jen | G02F 1/1345 349/151 |
| 2010/0320544 A1* | 12/2010 | Tseng | H01L 27/0629 257/380 |
| 2011/0090436 A1* | 4/2011 | Choi | G02F 1/136286 349/106 |
| 2011/0248971 A1* | 10/2011 | Huang | G09G 3/3677 345/205 |
| 2015/0221272 A1* | 8/2015 | Xu | G09G 3/36 345/211 |
| 2015/0227013 A1 | 8/2015 | Hao et al. | |
| 2016/0351151 A1* | 12/2016 | Cao | H01L 27/124 |
| 2017/0124972 A1* | 5/2017 | Kim | G09G 3/3648 |
| 2017/0162105 A1* | 6/2017 | Kim | G09G 3/2092 |

* cited by examiner

GOA DRIVING PANEL

CROSS REFERENCE TO RELATED APPLICATION

The present application claims priority of Chinese patent application CN201710107103.1, entitled "GOA Driving Panel" and filed on Feb. 27, 2017, the entirety of which is incorporated herein by reference.

FIELD OF THE INVENTION

The present disclosure relates to the technical field of display, and particularly to a gate driver on array (GOA) driving panel.

BACKGROUND OF THE INVENTION

As a mainstream display panel at present, liquid crystal display panel is widely used in electronic products of daily life, and problems which affect display quality of the liquid crystal display panel, such as image delay and image flicker, have drawn close attention.

In order to reduce a frame width of a screen, a Gate Driver On Array (GOA) technology is widely used. According to the GOA technology, not only a cost of a panel can be saved, but also a frame width thereof can be reduced.

However, during scanning signal transmission procedure, an RC delay effect of resistors and capacitors in the panel will lead to delay of the scanning signal. As a result, non-uniform display and image flicker will be generated.

SUMMARY OF THE INVENTION

In order to solve the aforesaid technical problem, the present disclosure provides a GOA driving panel, whereby difference among feed-through voltages of pixels in different regions of the panel can be reduced, an image flicker can be reduced, and a display quality of the panel can be improved.

According to one embodiment of the present disclosure, a GOA driving panel is provided. The GOA driving panel comprises an active area and a non-active area arranged at two opposite sides of the active area, wherein the non-active area is provided with a plurality of GOA driving units, and each GOA driving unit is connected with one corresponding scanning line in the active area for outputting a scanning signal to the scanning line; and wherein the non-active area is further provided with a plurality of signal waveform delay units, and each signal waveform delay unit is arranged between a GOA driving unit and a corresponding scanning line so as to reduce difference among feed-through voltages of pixels in different regions of the panel.

According to one embodiment of the present disclosure, the signal waveform delay unit comprises a resistor. The resistor is in series connection with the GOA driving unit and a corresponding scanning line. The resistors in the signal waveform delay units have an equal resistance.

According to one embodiment of the present disclosure, a resistance of the resistor is in a range from $10\Omega$ to $10000\Omega$.

According to one embodiment of the present disclosure, the resistor is made of a metal material.

According to one embodiment of the present disclosure, the resistor is made of a polysilicon material.

According to one embodiment of the present disclosure, the resistor is made of an Indium Tin Oxide (ITO) material.

According to one embodiment of the present disclosure, the signal waveform delay unit further comprises:

a substrate;

a buffer layer, which is arranged on the substrate; and a first metal layer, which is arranged on the buffer layer and comprises a metal winding serving as the resistor.

According to one embodiment of the present disclosure, the signal waveform delay unit further comprises:

a substrate;

a buffer layer, which is arranged on the substrate;

a first metal layer, which is arranged on the buffer layer;

a first insulation layer, which is arranged on the first metal layer; and a second metal layer, which is arranged on the first insulation layer and comprises a metal winding serving as the resistor.

According to one embodiment of the present disclosure, the signal waveform delay unit further comprises:

a substrate;

a buffer layer, which is arranged on the substrate; and a polysilicon island layer, which is arranged on the buffer layer and comprises a polysilicon island serving as the resistor.

According to one embodiment of the present disclosure, the signal waveform delay unit further comprises:

a substrate;

a buffer layer, which is arranged on the substrate;

a first metal layer, which is arranged on the buffer layer;

a first insulation layer, which is arranged on the first metal layer;

a second metal layer, which is arranged on the first insulation layer;

a second insulation layer, which is arranged on the second metal layer; and an ITO film layer, which is arranged on the second insulation layer and comprises an ITO film serving as the resistor.

The following beneficial effects can be brought about according to the present disclosure.

According to the present disclosure, a signal waveform delay unit is arranged between each GOA driving unit and a corresponding scanning line, whereby difference among feed-through voltages of pixels in different regions of the panel can be reduced, image flicker of the panel can be reduced, and a display quality of the panel can be improved.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings:

FIG. 1 schematically shows a principle of a panel in the prior art as to why image flicker is resulted in;

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1:
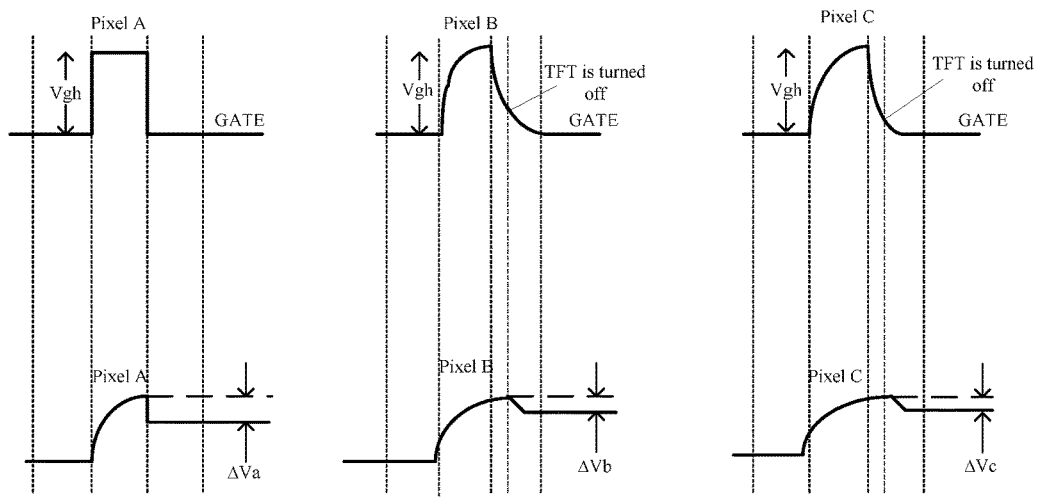
Figure 2:
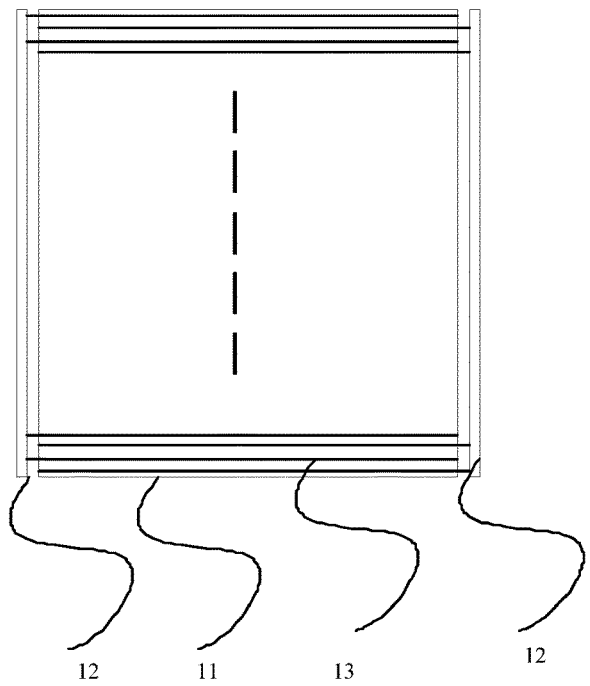
FIG. 2 schematically shows a structure of a liquid crystal display panel in the prior aet.

FIG. 1 schematically shows a principle of a panel in the prior art as to why image flicker and non-uniform display are resulted in, and a corresponding structure of the display panel in the prior art is shown in FIG. 2. As shown in FIG. 2, a GOA circuit 12 is arranged at two opposite sides of an active area 11 for outputting a GOA signal (i.e., a scanning signal). The GOA signal is transmitted to a corresponding pixel through a scanning line 13.

As shown in FIG. 1, pixel A, pixel B, and pixel C are arranged in a row direction in sequence, wherein above three curves represent pixel voltages corresponding to each pixel, and below three curves represent feed-through voltages corresponding to each pixel. It is assumed that the GOA circuit 12 is arranged at a left side of the pixel A. In this case, the GOA circuit 12 is the nearest to the pixel A, and a distance between the GOA circuit 12 and the pixel C is larger than a distance between the GOA circuit 12 and the pixel B. When the GOA circuit 12 outputs a scanning signal, a waveform of the scanning signal is nearly an ideal square wave when it arrives at the pixel A. An amplitude of a pulse of the waveform is Vgh, and there is not delay phenomenon at a rising edge and a declining edge thereof. When the GOA circuit 12 stops outputting a scanning signal, a voltage Vgh of the scanning line drops to zero rapidly (here, it is assumed that the voltage of the scanning line is zero when there is no scanning signal on the scanning line, and the present disclosure is not limited by this). At this time, a feed-through voltage of the pixel A is ΔVa.

Compared with the pixel A, the pixel B has a farther distance from the GOA driving circuit 12, and there is an RC delay when the scanning signal arrives at the pixel B. The RC delay would result in deformation of the waveform of the scanning signal, as shown by the above pulse waveform corresponding to pixel B in FIG. 1. Since the switching Thin Film Transistor (TFT) connected with the scanning line is turned off at a certain voltage lower than Vgh (as shown by the above waveform corresponding to pixel B in FIG. 1), the voltage on the scanning line is a certain value lower than Vgh at this time. The voltage of the scanning line is zero when there is no scanning signal on the scanning line. Therefore, a feed-through voltage of the pixel B is ΔVb, and ΔVb is less than ΔVa. Similarly, there is also an RC delay when the scanning signal arrives at the pixel C, and thus a feed-through voltage of the pixel C is ΔVc. In addition, ΔVc is less than ΔVa, and ΔVb is almost equal to ΔVc. Since the feed-through voltage of one pixel is different from that of another pixel, a voltage difference between a pixel near an edge of the panel and a common electrode is different from a voltage difference between a pixel at a central part of the panel and the common electrode. As a result, an image flicker and non-uniform display will be resulted in.

In order to solve the aforesaid technical problem, the present disclosure provides a GOA driving panel. In the GOA driving panel, a signal waveform delay unit is arranged between a GOA driving unit and a corresponding scanning line. The signal waveform delay unit is arranged in a non-active area of the panel, whereby waveform difference of the scanning signal at different regions of the panel resulted from the delay effect thereof can be reduced, and difference among feed-through voltages of pixels in different regions of the panel resulted from the waveform difference of the scanning signal can be reduced accordingly. In this manner, image flicker of the panel can be reduced, and a display quality thereof can be improved.

Figure 3:
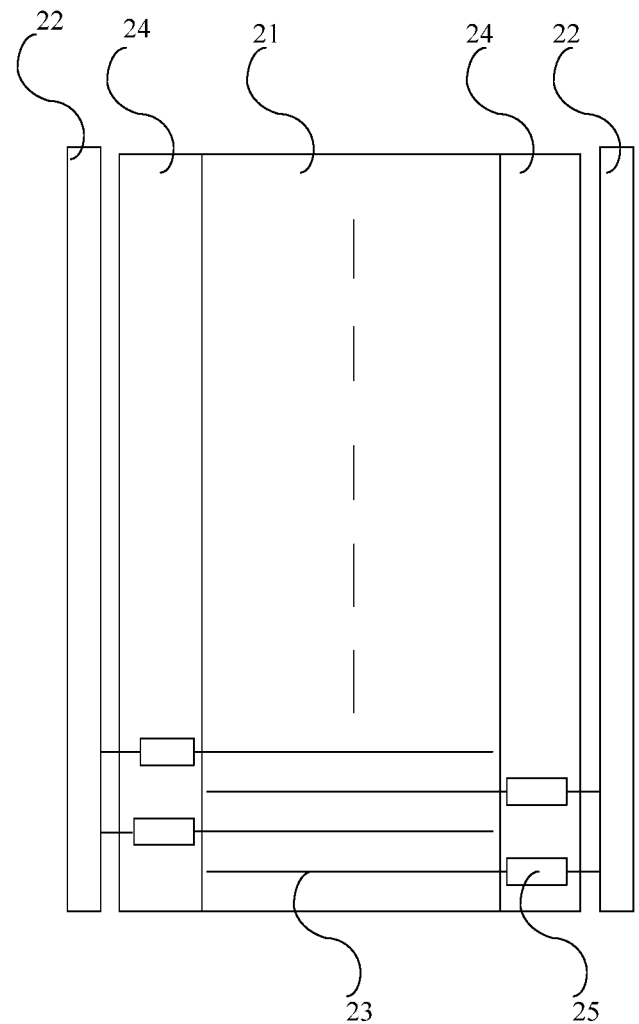
FIG. 3 schematically shows a structure of a liquid crystal display panel according to one embodiment of the present disclosure.

As shown in FIG. 3, the GOA driving panel comprises an active area 21 and a non-active area 24 arranged at two opposite sides of the active area. The non-active area 24 is provided with a plurality of GOA driving units 22, and each GOA driving unit 22 is connected with one scanning line 23 in the active area 21 for outputting a scanning signal to a corresponding scanning line. The non-active area 24 is further provided with a plurality of signal waveform delay units 25, and each signal waveform delay unit 25 is arranged between a GOA driving unit 22 and a corresponding scanning line so as to reduce difference among feed-through voltages of pixels in different regions of the panel.

According to the present disclosure, the scanning signal output by the GOA driving unit 22 can be processed by the signal waveform delay unit 25, so that the scanning signal can be output after waveform delay. That is, waveform delay occurs to the scanning signal before the scanning signal is input to each scanning line of the display panel. After waveform delay, the scanning signal drops from Vgh to zero through a gradually changing procedure. During the gradually changing procedure, there is a moment at which the voltage on the scanning line is equal to a turn-off voltage of the switching TFT. When the voltage on the scanning line drops to the turn-off voltage of the switching TFT, the switching TFT is turned off. At last, the voltage on the scanning line drops to zero. Since when the switching TFT is turned off, the scanning lines corresponding to each pixel have an equal voltage, and the scanning lines have an equal voltage when there is no scanning signal thereon, the pixels of the panel have a basically equal feed-through voltage. Therefore, the image flicker of the panel can be eliminated.

Figure 5:
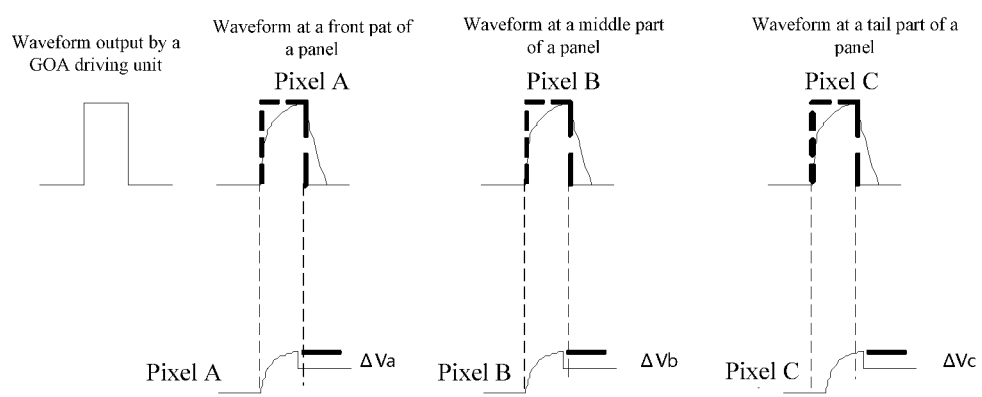
FIG. 5 schematically shows a waveform of a scanning signal output by a GOA driving unit according to one embodiment of the present disclosure.

FIG. 5 schematically shows an input waveform of a pixel and a corresponding feed-through voltage at different positions of a display panel according to one embodiment of the present disclosure. As shown in FIG. 5, above three curves represent pixel voltages corresponding to each pixel, and below three curves represent feed-through voltages corresponding to each pixel. It can be seen from FIG. 5 that, the scanning signal output by the GOA driving unit 22 is an ideal pulse waveform. The ideal pulse waveform, after passing through the signal waveform delay unit 25, arrives at pixel A at a front part of the panel, pixel B at a middle part of the panel, and pixel C at a tail part of the panel respectively. Moreover, waveform delay occurs to the signal at the pixel A, the pixel B, and the pixel C, as shown by solid lines in FIG. 5. With respect to the pixel A, delay effect occurs to a dropping edge of the scanning signal, so that a voltage difference of the pixel A before and after the TFT is turned off can be reduced, and a feed-through voltage of the pixel A can be reduced accordingly. The feed-through voltage of the pixel A, the feed-through voltage of the pixel B, and the feed-through voltage of the pixel C can be maintained roughly equal to one another through reasonably arranging a delay parameter of the signal waveform delay unit, whereby image flicker of the display panel can be eliminated, and the display quality of the panel can be improved.

Figure 4:
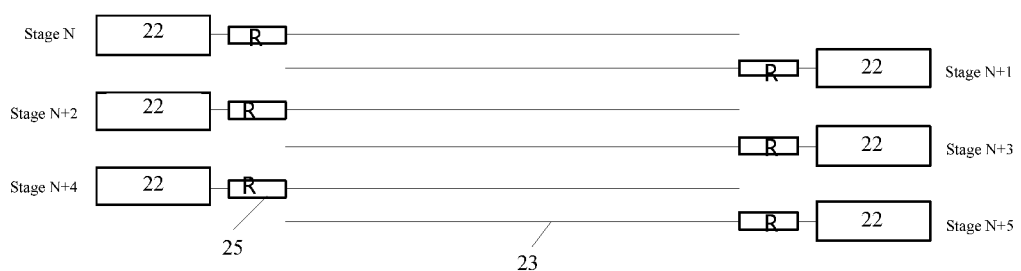
FIG. 4 schematically shows a connection of a GOA driving unit and a corresponding scanning line and resistor according to one embodiment of the present disclosure.

According to one embodiment of the present disclosure, the signal waveform delay unit comprises a resistor R. The resistor R is in series connection with the GOA driving unit 22 and a corresponding scanning line 23. The resistors R in the signal waveform delay units 25 have an equal resistance, as shown in FIG. 4. That is, the signal waveform delay unit 25 is provided with a resistor R, and the resistor R is arranged between the GOA driving unit 22 and the corresponding scanning line 23. The waveform delay of the scanning signal can be realized by the resistor R. Of course, the waveform delay of the scanning signal can also be realized by an inductor or other component, and a quantity of the resistor in the signal waveform delay unit is not necessarily one. The present disclosure is not limited by this.

With respect to a panel with a certain size, a length of the scanning line is determined, and the scanning lines each have an equal length. Therefore, the resistor in each signal waveform delay unit 25 can be arranged to have an equal resistance. Based on a common size of the display panel, the resistance of the resistor can be arranged in a range from 10Ω to 10000Ω, and a specific value can be determined according to the size of the panel.

According to a manufacturing technology of a display panel and a material used in each manufacturing procedure, the resistor R is made of a metal material in one embodiment of the present disclosure. During a procedure when a metal layer of the active area of the panel is manufactured, the metal wiring is manufactured to serve as the resistor R. The resistor R with a needed resistance can be obtained through regulating a length of the metal wiring.

According to another embodiment of the present disclosure, the resistor R is made of a polysilicon material. Specifically, during a procedure when a polysilicon island of the active area of the panel is manufactured, the resistor with the polysilicon material is manufactured. The resistance of the resistor with the polysilicon material can be obtained through regulating a concentration of a doping ion of the polysilicon island.

According to another embodiment of the present disclosure, the resistor R is made of an Indium Tin Oxide (ITO) material. Specifically, during a procedure when a pixel electrode of the active area of the panel is manufactured, the resistor with the ITO material is manufactured. The resistance of the resistor with the ITO material can be obtained through regulating an area of an ITO film.

According to another embodiment of the present disclosure, the signal waveform delay unit further comprises a substrate, a buffer layer, and a first metal layer. The buffer layer is arranged on the substrate. The first metal layer is arranged on the buffer layer. The first metal layer comprises a metal winding serving as the resistor R. Combining the manufacturing procedure of the liquid crystal display panel, during a procedure when the first metal layer is formed, a gate (or a source-drain, and a data line) of the TFT and the resistor R can be formed at the same time, and then other layers can be formed on the first metal layer. In this manner, the resistor R with the metal material can be formed at the same time when the gate of the TFT, or the source-drain thereof, and the data line are formed.

According to another embodiment of the present disclosure, the signal waveform delay unit further comprises a substrate, a buffer layer, a first metal layer, a first insulation layer, and a second metal layer. The buffer layer is arranged on the substrate. The first metal layer is arranged on the buffer layer and corresponds to the gate of the TFT, or the source-drain and the data line. The first insulation layer is arranged on the first metal layer. The second metal layer is arranged on the first insulation layer and comprises a metal winding serving as the resistor R. In addition, the second metal layer generally comprises a source-drain and a data line corresponding to the gate of the first metal layer, or a gate corresponding to the source-drain and the data line of the first metal layer. In this manner, the resistor R with the metal material can be formed at the same time when the gate of the TFT, or the source-drain thereof, and the data line are formed.

According to one embodiment of the present disclosure, the signal waveform delay unit further comprises a substrate, a buffer layer, and a polysilicon island layer. The buffer layer is arranged on the substrate. The polysilicon island layer is arranged on the buffer layer and comprises a polysilicon island serving as the resistor R. In addition, the polysilicon island layer further comprises a polysilicon island arranged in the active area and serving as a channel of the TFT. The resistance of the polysilicon island arranged in the non-active area and serving as the resistor R can be regulated through regulating a concentration of a doping ion thereof.

According to another embodiment of the present disclosure, the signal waveform delay unit further comprises a substrate, a buffer layer, a first metal layer, a first insulation layer, a second metal layer, a second insulation layer, and an ITO film layer. The buffer layer is arranged on the substrate. The first metal layer is arranged on the buffer layer and corresponds to a gate of a TFT, or a source-drain and a data line. The first insulation layer is arrange on the first metal layer. The second metal layer is arranged on the first insulation layer and comprises a source-drain and a data line corresponding to the gate of the first metal layer, or a gate corresponding to the source-drain and the data line of the first metal layer. The second insulation layer is arrange on the second metal layer. The ITO film layer is arranged on the second insulation layer and comprises an ITO film serving as the resistor R. In addition, the ITO film layer generally comprises an ITO film arranged in the active area and serving as a pixel electrode. The resistance of the resistor R with ITO film material can be regulated through regulating an area, length, or width of the ITO film.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A Gate Driver On Array (GOA) driving panel, comprising an active area and a non-active area arranged at two opposite sides of the active area, wherein the non-active area is provided with a plurality of GOA driving units, and each GOA driving unit is connected with one corresponding scanning line in the active area for outputting a scanning signal to the scanning line; and wherein the non-active area is further provided with a plurality of signal waveform delay units, and each signal waveform delay unit is arranged between a GOA driving unit and a corresponding scanning line so as to reduce difference among feed-through voltages of pixels in different regions of the panel;

wherein the scanning signal is processed by the signal waveform delay units so that waveform delay occurs to the scanning signal before the scanning signal is input to each scanning line.

2. The panel according to claim 1, wherein the signal waveform delay unit comprises a resistor;

wherein the resistor is in series connection with the GOA driving unit and a corresponding scanning line; and wherein the resistors in the signal waveform delay units have an equal resistance.

3. The panel according to claim 2, wherein the signal waveform delay unit further comprises:
a substrate;
a buffer layer, which is arranged on the substrate; and
a first metal layer, which is arranged on the buffer layer and comprises a metal winding serving as the resistor.

4. The panel according to claim 2, wherein the signal waveform delay unit further comprises:
a substrate;
a buffer layer, which is arranged on the substrate;
a first metal layer, which is arranged on the buffer layer;
a first insulation layer, which is arranged on the first metal layer; and
a second metal layer, which is arranged on the first insulation layer and comprises a metal winding serving as the resistor.

5. The panel according to claim 2, wherein the signal waveform delay unit further comprises:
a substrate;
a buffer layer, which is arranged on the substrate; and
a polysilicon island layer, which is arranged on the buffer layer and comprises a polysilicon island serving as the resistor.

6. The panel according to claim 2, wherein the signal waveform delay unit further comprises:
a substrate;
a buffer layer, which is arranged on the substrate;
a first metal layer, which is arranged on the buffer layer;
a first insulation layer, which is arranged on the first metal layer;
a second metal layer, which is arranged on the first insulation layer;
a second insulation layer, which is arranged on the second metal layer; and
an Iridium Tin Oxide (ITO) film layer, which is arranged on the second insulation layer and comprises an ITO film serving as the resistor.

7. The panel according to claim 2, further comprising a plurality of switching Thin Film Transistor (TFT), wherein each switching TFT is connected to one corresponding scanning line and is configured to turn off according to a voltage on the corresponding scanning line.

8. The panel according to claim 7, wherein the signal waveform delay unit further comprises:
a substrate;
a buffer layer, which is arranged on the substrate; and
a first metal layer, which is arranged on the buffer layer and comprises a metal winding serving as the resistor.

9. The panel according to claim 8, wherein, during a procedure when the first metal layer is formed, a gate of the switching TFT and the resistor are formed at the same time.

10. The panel according to claim 8, wherein, during a procedure when the first metal layer is formed, a source-drain and a data line of the switching TFT and the resistor are formed at the same time.

11. The panel according to claim 7, wherein the signal waveform delay unit further comprises:
a substrate;
a buffer layer, which is arranged on the substrate;
a first metal layer, which is arranged on the buffer layer;
a first insulation layer, which is arranged on the first metal layer; and
a second metal layer, which is arranged on the first insulation layer and comprises a metal winding serving as the resistor.

12. The panel according to claim 11, wherein the first metal layer corresponds to a gate of the switching TFT, and the second metal layer further includes a source-drain and a data line of the switching TFT.

13. The panel according to claim 12, wherein the first metal layer corresponds to a source-drain and a data line of the switching TFT, and the second metal layer further includes a gate of the switching TFT.

14. The panel according to claim 7, wherein the signal waveform delay unit further comprises:
a substrate;
a buffer layer, which is arranged on the substrate; and
a polysilicon island layer, which is arranged on the buffer layer and comprises a polysilicon island serving as the resistor.

15. The panel according to claim 14, wherein the the polysilicon island layer further comprises a polysilicon island arranged in the active area and serving as a channel of the switching TFT.

16. The panel according to claim 7, wherein the signal waveform delay unit further comprises:
a substrate;
a buffer layer, which is arranged on the substrate;
a first metal layer, which is arranged on the buffer layer;
a first insulation layer, which is arranged on the first metal layer;
a second metal layer, which is arranged on the first insulation layer;
a second insulation layer, which is arranged on the second metal layer; and
an Iridium Tin Oxide (ITO) film layer, which is arranged on the second insulation layer and comprises an ITO film serving as the resistor.

17. The panel according to claim 16, wherein the first metal layer corresponds to a gate of the switching TFT, and the second metal layer further includes a source-drain and a data line of the switching TFT.

18. The panel according to claim 16, wherein the first metal layer corresponds to a source-drain and a data line of the switching TFT, and the second metal layer further includes a gate of the switching TFT.

19. The panel according to claim 16, wherein the ITO film layer further includes an ITO film arranged in the active area and serving as a pixel electrode.

* * * * *